United States Patent
Xu

(10) Patent No.: US 10,510,872 B2
(45) Date of Patent: Dec. 17, 2019

(54) FINFETS AND METHODS FOR FORMING THE SAME

(71) Applicant: Taiwan Semiconductor Manufacturing Company, Ltd., Hsinchu (TW)

(72) Inventor: Jeffrey Junhao Xu, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/531,573

(22) Filed: Aug. 5, 2019

(65) Prior Publication Data

US 2019/0355839 A1    Nov. 21, 2019

Related U.S. Application Data

(60) Continuation of application No. 15/722,640, filed on Oct. 2, 2017, now Pat. No. 10,374,063, which is a
(Continued)

(51) Int. Cl.
| | |
|---|---|
| *H01L 29/66* | (2006.01) |
| *H01L 29/78* | (2006.01) |
| *H01L 29/167* | (2006.01) |
| *H01L 29/16* | (2006.01) |
| *H01L 29/10* | (2006.01) |

(Continued)

(52) U.S. Cl.
CPC .. *H01L 29/66795* (2013.01); *H01L 21/02694* (2013.01); *H01L 21/76224* (2013.01); *H01L 29/1054* (2013.01); *H01L 29/167* (2013.01); *H01L 29/1608* (2013.01); *H01L 29/66545* (2013.01); *H01L 29/785* (2013.01); *H01L 29/7851* (2013.01)

(58) Field of Classification Search
CPC ............... H01L 29/167; H01L 29/1608; H01L 29/66545; H01L 29/66795; H01L 29/7851; H01L 21/02694; H01L 21/76224
See application file for complete search history.

(56) References Cited

U.S. PATENT DOCUMENTS

| 6,458,662 B1 | 10/2002 | Yu |
| 7,214,993 B2 | 5/2007 | Yang |

(Continued)

FOREIGN PATENT DOCUMENTS

| JP | 2012049286 A | 3/2012 |
| JP | 2013030776 A | 2/2013 |
| KR | 1020120128531 A | 11/2012 |

OTHER PUBLICATIONS

Campbell, Stephen A., "The Science and Engineering of Microelectronic Fabrication," University of Minnesota, Oxford University Press, 2001, 4 pp.

*Primary Examiner* — Peniel M Gumedzoe
(74) *Attorney, Agent, or Firm* — Slater Matsil, LLP

(57) ABSTRACT

A FinFET includes a semiconductor fin including an inner region, and a germanium-doped layer on a top surface and sidewall surfaces of the inner region. The germanium-doped layer has a higher germanium concentration than the inner region. The FinFET further includes a gate dielectric over the germanium-doped layer, a gate electrode over the gate dielectric, a source region connected to a first end of the semiconductor fin, and a drain region connected to a second end of the semiconductor fin opposite the first end. Through the doping of germanium in the semiconductor fin, the threshold voltage may be tuned.

20 Claims, 10 Drawing Sheets

Related U.S. Application Data continuation of application No. 15/058,657, filed on Mar. 2, 2016, now Pat. No. 9,806,177, which is a division of application No. 13/789,812, filed on Mar. 8, 2013, now Pat. No. 9,299,840.

(51) Int. Cl.
*H01L 21/02* (2006.01)
*H01L 21/762* (2006.01)

(56) References Cited

U.S. PATENT DOCUMENTS

| | | |
|---|---|---|
| 8,685,825 B2 | 4/2014 | Tang et al. |
| 2004/0256683 A1 | 12/2004 | Lee et al. |
| 2006/0231907 A1 | 10/2006 | Kim et al. |
| 2007/0063275 A1 | 3/2007 | Noda |
| 2007/0090416 A1 | 4/2007 | Doyle et al. |
| 2008/0003725 A1 | 1/2008 | Orlowski |
| 2008/0020515 A1 | 1/2008 | White et al. |
| 2010/0200916 A1 | 8/2010 | Gossner et al. |
| 2011/0147811 A1 | 6/2011 | Kavalieros et al. |
| 2012/0052664 A1 | 3/2012 | Fuse et al. |
| 2012/0292715 A1 | 11/2012 | Hong et al. |
| 2013/0049121 A1 | 2/2013 | Baldauf et al. |
| 2013/0052801 A1 | 2/2013 | Berliner et al. |
| 2014/0252475 A1 | 9/2014 | Xu et al. |

FINFETS AND METHODS FOR FORMING THE SAME

PRIORITY CLAIM AND CROSS-REFERENCE

This application is a continuation of U.S. patent application Ser. No. 15/722,640, entitled "FinFETs and Methods for Forming the Same," filed on Oct. 2, 2017, which is a continuation of U.S. patent application Ser. No. 15/058,657, entitled "FinFETs and Methods for Forming the Same," filed on Mar. 2, 2016, now U.S. Pat. No. 9,806,177 issued Oct. 31, 2017, which is a divisional of U.S. patent application Ser. No. 13/789,812, entitled "FinFETs and Methods for Forming the Same," filed on Mar. 8, 2013, now U.S. Pat. No. 9,299,840 issued Mar. 29, 2016, which applications are incorporated herein by reference.

BACKGROUND

In the formation of a Field-Effect Transistor (FinFET), a semiconductor fin is formed first, followed by forming a gate stack on a portion of the semiconductor fin. The exposed end portions of the fin on opposite sides of the gate stack are removed to form recesses. Source and drain regions are then re-grown in the recesses through epitaxy.

In integrated circuits, transistors may need to have different threshold voltages. The threshold voltages of transistors may be adjusted by adjusting the channel doping concentrations in the transistors. In the FinFETs with narrow fins, however, the channel doping may fluctuate significantly. This is caused by thermal processes such as re-crystallization and activation processes. In the thermal processes, most of the channel dopants may be diffused away from fins, and the channel dopants that are left in the channel become an increasingly smaller portion with the increasingly narrowing of fins. As a result, heavier doses of impurities are needed.

Increasing the implantation doses, however, results in high threshold voltage variations. The out-diffusion of the impurity from a narrow fin is affected by various factors, and has high variations. From wafer to wafer, and even from FinFET to FinFET on the same wafer, the out-diffusion may vary significantly. This results in the channel doping concentration of the FinFETs to vary also. The threshold voltages of the resulting FinFETs thus have a high variation.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

Fin Field-Effect Transistors (FinFETs) and the methods of forming the same are provided in accordance with various embodiments. The intermediate stages of forming the FinFETs are illustrated. The variations of the embodiments are discussed. Throughout the various views and illustrative embodiments, like reference numbers are used to designate like elements.

Figure 1:
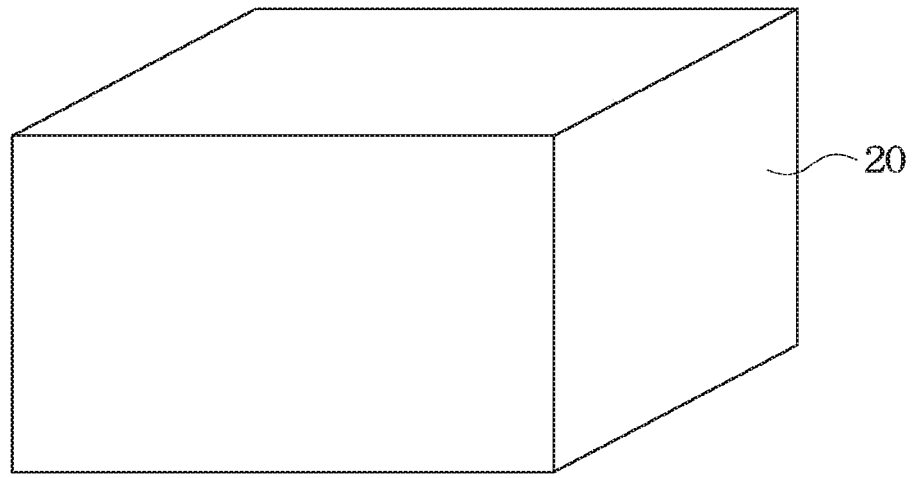
FIGS. 1 through 11C are perspective views and cross-sectional views of intermediate stages in the manufacturing of a first Fin Field-Effect Transistor (FinFET) in accordance with some exemplary embodiments, wherein germanium is doped in the respective channel to adjust the threshold voltage.

FIGS. 1 through 11C are cross-sectional views and perspective views of intermediate stages in the manufacturing of a FinFET in accordance with some exemplary embodiments. FIG. 1 illustrates a perspective view of substrate 20, which may be a part of a wafer. Substrate 20 may be a semiconductor substrate, which may further be a silicon substrate that is free from germanium, a silicon carbon substrate, or a substrate formed of other semiconductor materials. Substrate 20 may be lightly doped with a p-type or an n-type impurity.

Figure 2:
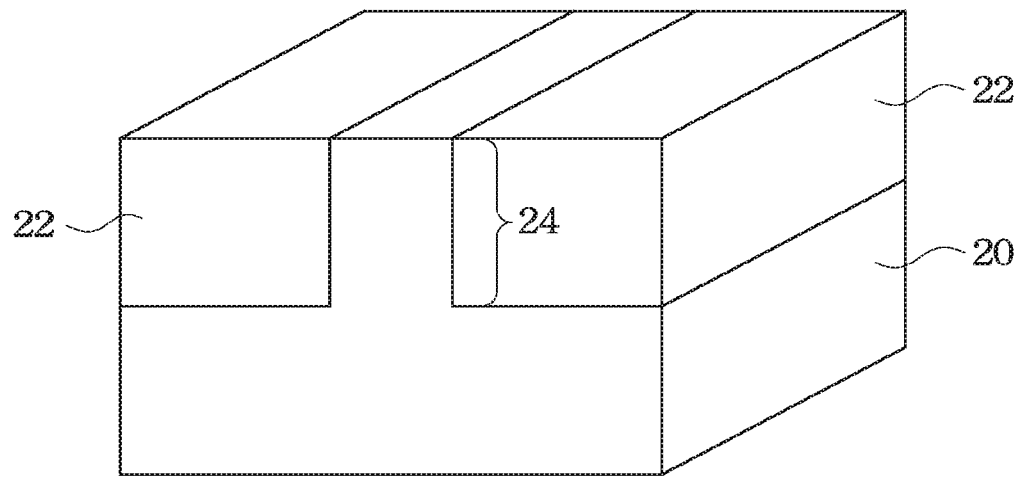

Next, referring to FIG. 2, isolation regions 22 are formed, which extend from a top surface of substrate 20 into substrate 20. Isolation regions 22 may be Shallow Trench Isolation (STI) regions, and are referred to as STI region 22 hereinafter. The formation of STI regions 22 may include etching semiconductor substrate 20 to form trenches (not shown), and filling the trenches with a dielectric material to form STI regions 22. STI regions 22 may be formed of silicon oxide, for example, although other dielectric materials may also be used. The portion of substrate 20 between neighboring STI regions 22 is referred to as semiconductor strip 24 throughout the description. The top surface of semiconductor strip 24 and the top surfaces of STI regions 22 may be substantially level with each other, although they may be at slightly different levels.

Figure 3:
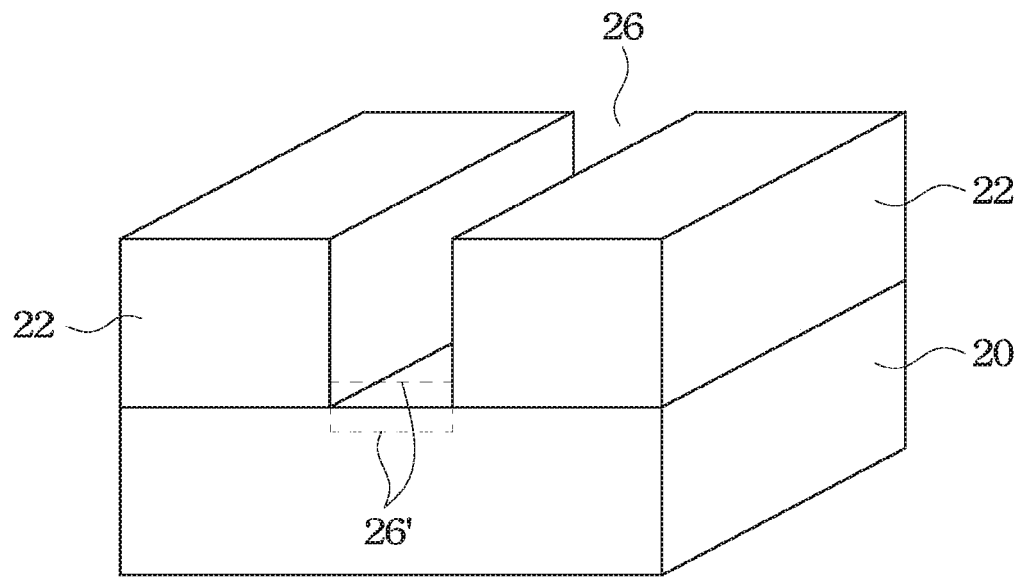
Figure 4:
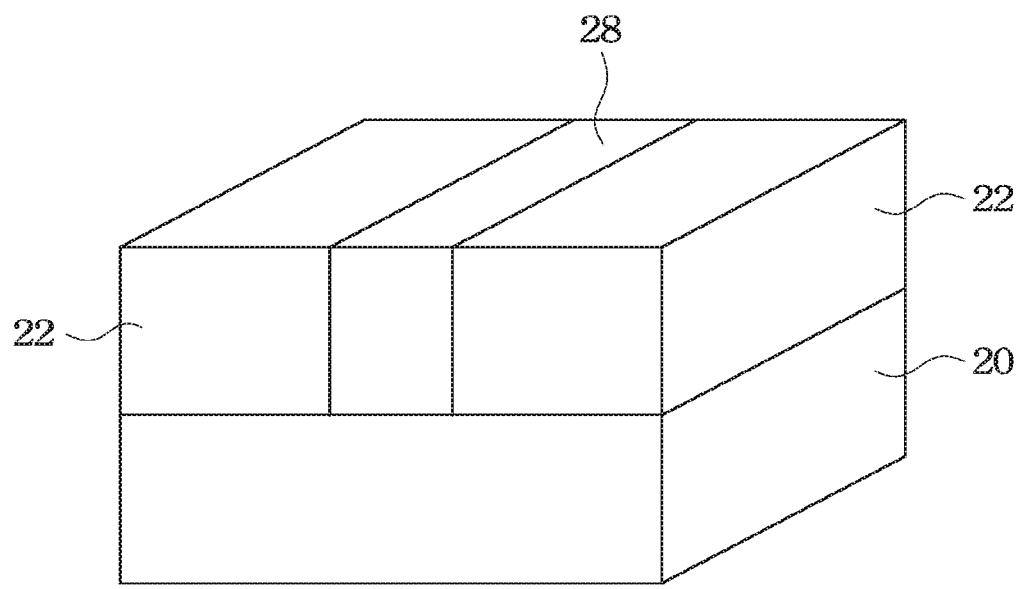

FIGS. 3 and 4 illustrate the re-growth of semiconductor strip 28 in accordance with some embodiments. In alternative embodiments, the steps in FIGS. 3 and 4 are skipped. Referring to FIG. 3, at least a top portion of, or substantially an entirety of, semiconductor strip 24 is removed. Accordingly, recess 26 is formed between STI regions 22. The bottom surface of recess 26 may be level with the bottom surfaces of STI regions 22. Alternatively, the bottom surface of recess 26 may be higher than or lower than the bottom surfaces of STI regions 22, wherein dashed lines 26' illustrate the likely positions of the respective bottoms of recess 26.

An epitaxy is performed to grow a semiconductor region in recess 26. The resulting structure is shown in FIG. 4, wherein the epitaxy semiconductor forms semiconductor strip 28. A Chemical Mechanical Polish (CMP) may be performed to level the top surface of semiconductor strip 28 with the top surfaces of STI regions 22. Semiconductor strip 28 may have a lattice constant greater than, substantially equal to, or smaller than, the lattice constant of substrate 20. In some embodiments, semiconductor strip 28 comprises silicon germanium, silicon carbon, a III-V compound semiconductor, a II-VI compound semiconductor, or the like. For example, the available materials for forming III-V compound semiconductor strip 28 include, but are not limited to, InAs, AlAs, GaAs, InP, GaN, InGaAs, InAlAs, GaSb, AlSb, AlP, GaP, and the like. The top surface of the resulting semiconductor strips 28 may be higher than, level with, or lower than the top surface of STI regions 22.

In some embodiments, semiconductor strip 28 is in-situ doped during the epitaxy to have an n-type or p-type conductivity. In alternative embodiments, semiconductor strip 28 is intrinsic, and is not doped during and after the epitaxy. Semiconductor strip 28 may be unintentionally doped due to the use of the precursor for growing semiconductor strip 28. When semiconductor strip 28 is doped after the epitaxy, the doping may be performed through an implantation of the desirable impurity. In some embodiments in which semiconductor strip 28 comprises a III-V compound semiconductor, the impurity that may be doped to cause semiconductor strip 28 to be n-type comprises Si, Te, or the like, and the impurity that may be doped to cause semiconductor strip 28 to be p-type comprises C, Zn, or the like. After the doping, semiconductor strip 28 may be lightly-doped n-type (referred to as n−) or lightly-doped p-type (referred to as p−). In alternative embodiments, semiconductor strip 28 may be moderately-doped n-type (referred to as n) or moderately-doped p-type (referred to as p). In the described embodiments, the term "heavily doped" means an impurity concentration of above about $10^{19}/cm^3$, the term "lightly doped" means an impurity concentration lower than about $10^{13}/cm^3$, and the term "moderately doped" means an impurity concentration higher than lightly doped and lower than heavily doped. One skilled in the art will recognize, however, that "heavily doped," "moderately doped," and "lightly doped" are terms of art that depend upon the specific device type, technology generation, minimum feature size, and the like. It is intended, therefore, that the terms be interpreted in light of the technology being evaluated and not be limited to the described embodiments.

In some embodiments, the process steps in FIGS. 3 and 4 are skipped, and semiconductor strip 24 in FIG. 2 remains. In which embodiments, semiconductor strip 24 in FIG. 2 is also referred to as semiconductor strip 28. In these embodiments, the resulting semiconductor strip 28 as in FIG. 4 is formed of the same semiconductor material as semiconductor substrate 20, which may be silicon, for example. An implantation may be performed to dope semiconductor strip 28 as p/p− type when the respective FinFET 60 (FIG. 11A) is a p-type FinFET, or dope semiconductor strip 28 as n/n− type when the respective FinFET 60 (FIG. 11A) is an n-type FinFET.

Figure 5:
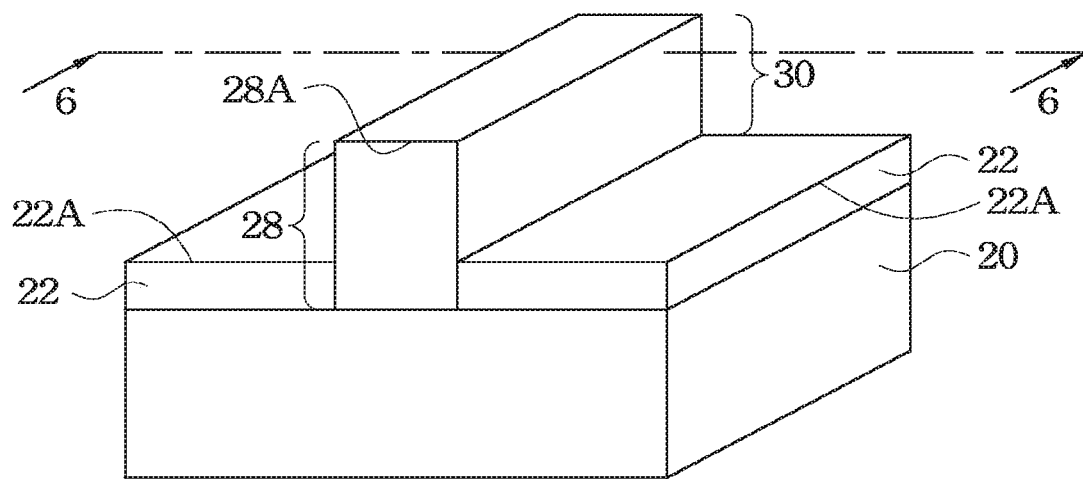

Referring to FIG. 5, STI regions 22 are recessed, for example, through an etching step. The top surfaces 22A of the remaining STI regions 22 is thus lower than top surface 28A of semiconductor strip 28. Throughout the description, the portion of semiconductor strip 28 over top surface 22A is referred to as semiconductor fin 30.

Figure 6A:
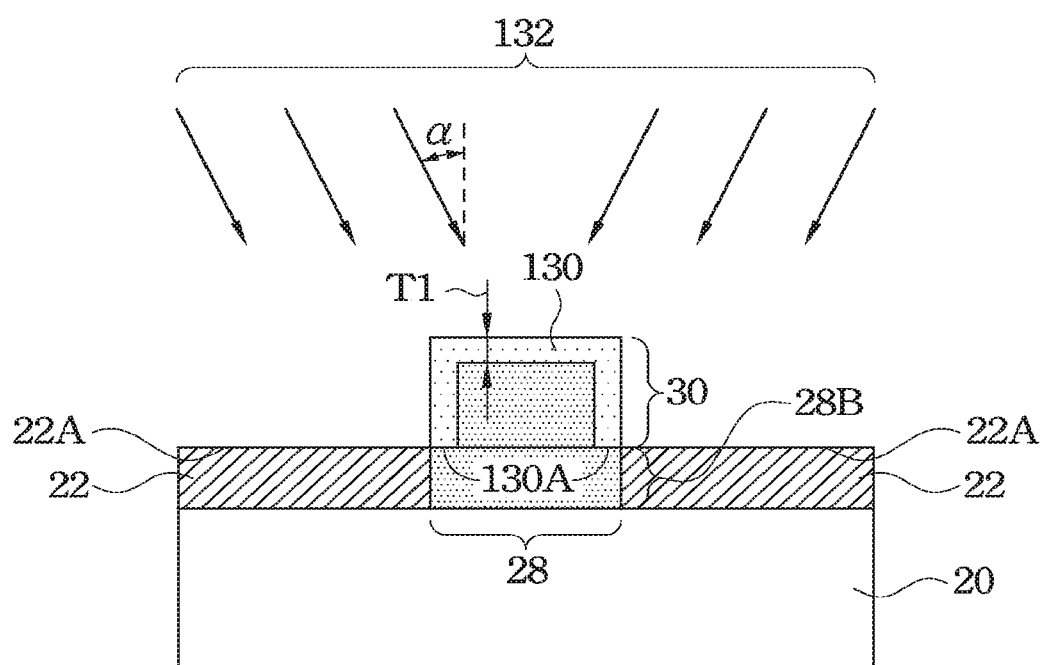
Figure 6B:
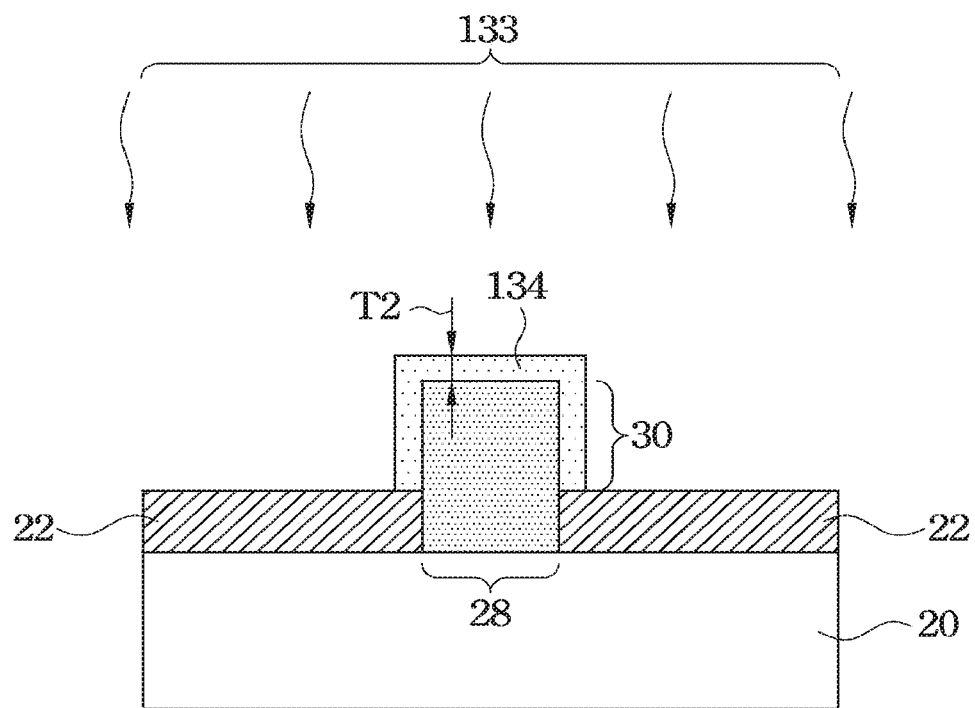
Figure 6C:
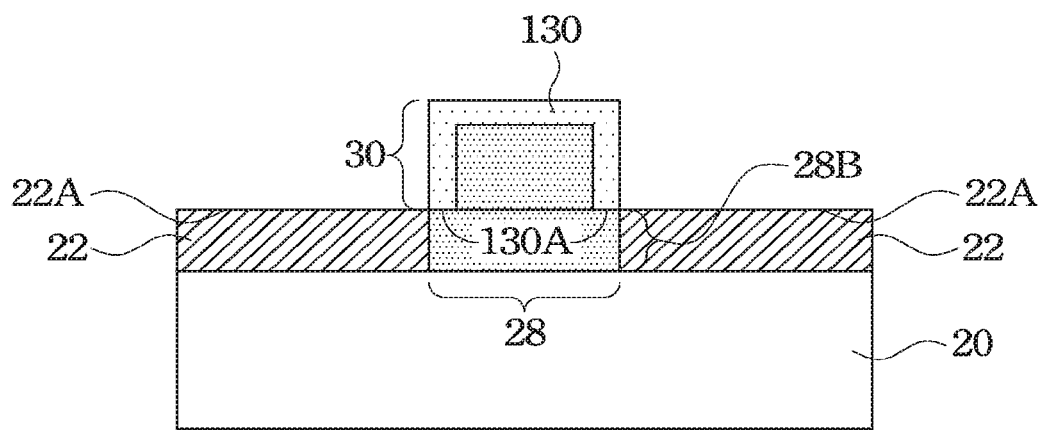
Figure 6D:
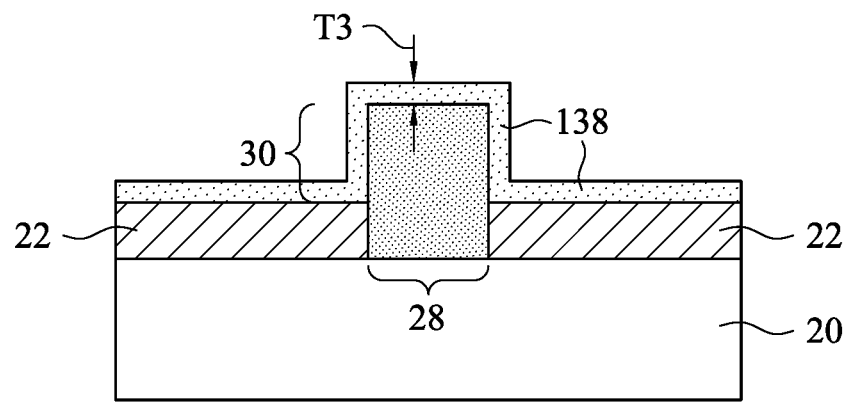
Figure 6E:
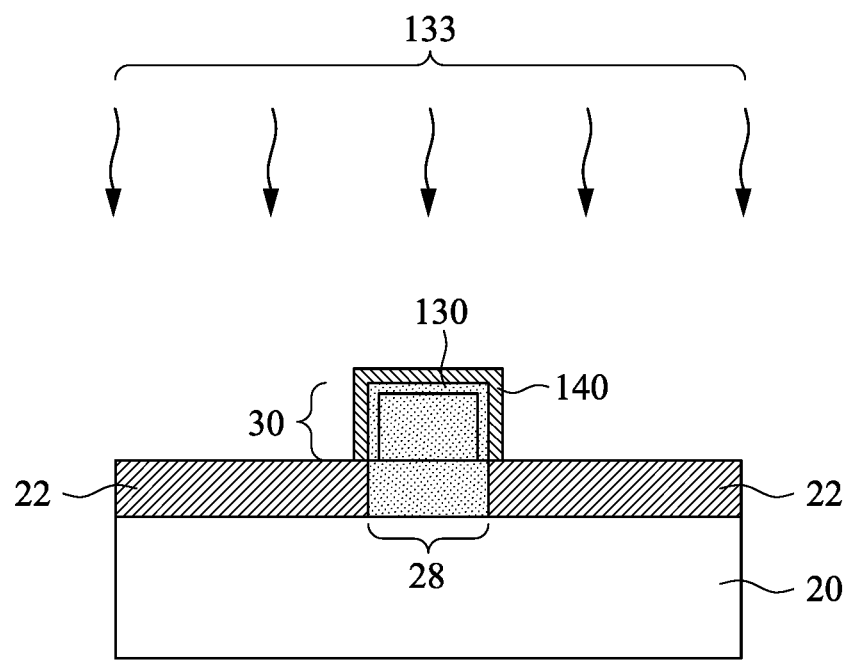
Figure 11A:
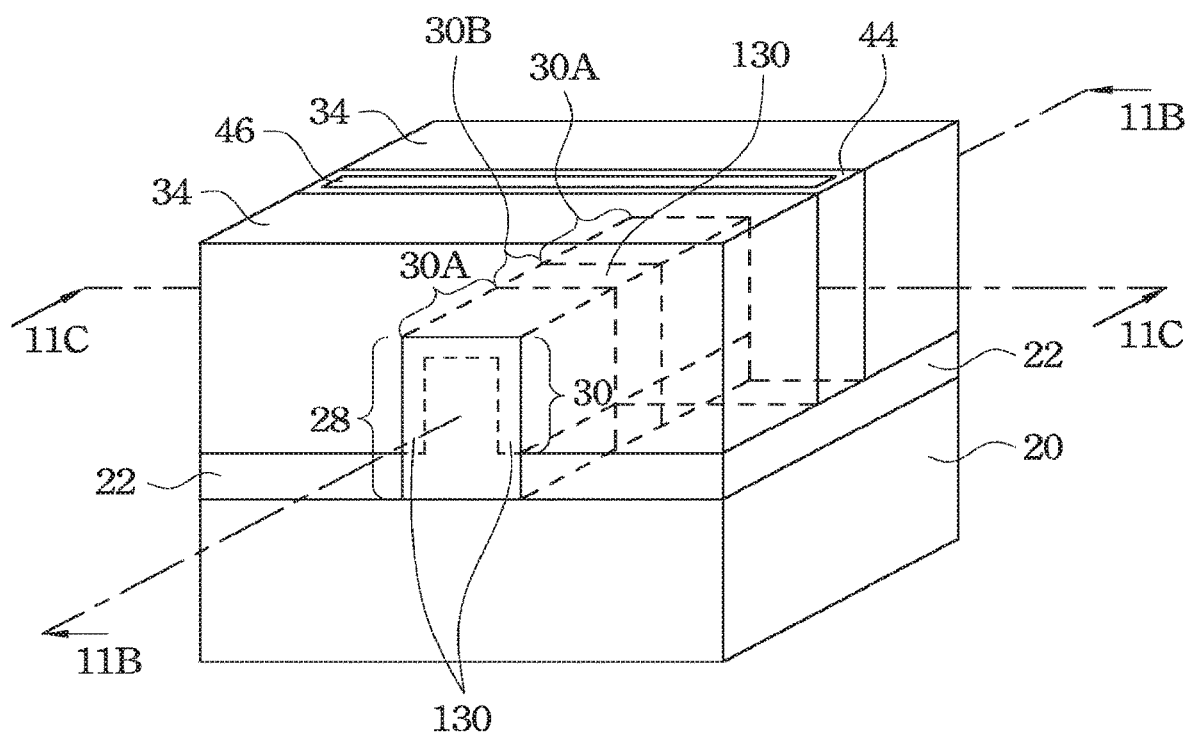

FIGS. 6A through 6E illustrate a plurality of processes for forming germanium (Ge) channel doping layer 130 (FIGS. 6A, 6C, and 6E). The cross-sectional views in FIGS. 6A through 6E are obtained from the same vertical plane crossing line 6-6 in FIG. 5. FIG. 6A illustrates the Ge channel doping through implantations 132. In some embodiments, Ge is doped through tilt implantations, wherein tile angle α may be between about 5 degrees and about 55 degrees, for example. The implantation results in the formation of germanium-doped layer 130, which is alternatively referred to as Ge channel doping layer 130 hereinafter. In some exemplary embodiments, the germanium concentration in Ge channel doping layer 130 is between about $4E20/cm^3$ and about $2E21/cm^3$, although higher or lower doping concentrations may be used, depending on the desirable threshold Vt of the resulting FinFET 60 (FIG. 11A). The implantation may be performed at a temperature between about 300° C. and about 500° C., for example. The germanium dosage may be between about $1E15/cm^2$ and about $5E15/cm^3$. In some embodiments, as shown in FIG. 6A, the implantation results in a surface layer of semiconductor fin 30 to be doped, wherein the surface layer comprises the top surface layer and the opposite sidewall surface layers of semiconductor fin 30. The inner portions of semiconductor fin 30 wrapped by Ge channel doping layer 130, however, may be free from germanium. Thickness T1 of Ge channel doping layer 130 may be between about 1 nm and about 4 nm, for example. In alternative embodiments, the implantation results in an entirety of semiconductor fin 30 to be doped with germanium.

FIGS. 6B and 6C illustrate the formation of Ge channel doping layer 130 through a conformal doping step. In some embodiments, as shown in FIG. 6B, germanium-containing layer 134, which comprises the active species of germanium, is deposited on the top surface and sidewall surfaces of semiconductor fin 30. Germanium-containing layer 134 may comprise substantially pure germanium although germanium alloy may also be used. The deposition method includes monolayer doping, solid state doping, plasma doping, and selective epitaxy, or the like. The deposition may be selective, and germanium-containing layer 134 is deposited on the surfaces of semiconductor fin 30, and not on the surfaces of STI regions 22. Thickness T2 of germanium-containing layer 134 may be between about 1 nm and about 5 nm, for example. A thermal anneal 133 is then performed to drive germanium atoms in germanium-containing layer 134 into the surface layer of germanium-containing layer 134. In some embodiments, the thermal anneal is performed at a temperature between about 900° C. and about 1,200° C. The thermal anneal may be performed for a period of time between about 1 millisecond and about 30 minutes, wherein nitrogen ($N_2$), hydrogen ($H_2$), or inert gases may be used in the thermal anneal as process gases. As a result of the thermal anneal, germanium atoms are diffused into semiconductor fin 30 to form Ge channel doping layer 130, as shown in FIG. 6C.

FIGS. 6D and 6E illustrate the formation of Ge channel doping layer 130 through germanium condensation in accordance with some embodiments. Referring to FIG. 6D, silicon germanium layer 138 is formed on the top surface and sidewalls of semiconductor fin 30, for example, through a selective deposition such as selective epitaxy. Thickness T3 of silicon germanium layer 138 may be between about 1 nm and about 5 nm, for example. The germanium percentage in silicon germanium layer 138 may be between about 5 percent and about 25 percent, although higher or lower percentages may be used. Next, a thermal oxidation (symbolized by arrows 135) is performed, wherein oxygen ($O_2$) may be used to oxidize silicon germanium layer 138. Since germanium requires a higher energy to oxidize than silicon, by selecting appropriate oxidation time and temperature, the silicon atoms in silicon germanium layer 138 are oxidized to form silicon oxide layer 140, as shown in FIG. 6E. The germanium atoms in silicon germanium layer 138 diffuse into semiconductor fin 30, forming Ge channel doping layer 130, which is underlying silicon oxide layer 140. Silicon oxide layer 140 is then removed. The resulting structure is similar to what is shown in FIG. 6A.

As shown in FIGS. 6A and 6C, bottom ends 130A of Ge channel doping layer 130 may be substantially level with top surfaces 22A of STI regions 22. Alternatively, bottom ends 130A may be slightly lower than top surfaces 22A. Accordingly, in some embodiments, portion 28B of semiconductor substrate 28, which portion is in STI regions 22, may be substantially free from Ge channel doping layer 130, although Ge channel doping layer 130 may extend into the top part of portion 28A, for example, due to implantation and/or diffusion. The bottom part of the portion 28A may be free from Ge channel doping layer 130.

In alternative embodiments, Ge channel doping layer 130 is not formed during this time. Rather, Ge channel doping layer 130 is formed in the step shown in FIGS. 10A, 10B, and 10C, which is after the formation and the removal of a dummy gate. Accordingly, in subsequent drawings, Ge channel doping layer 130 is illustrated using dashed lines to indicate that it may, or may not, exist in semiconductor fin 30.

Figure 7:
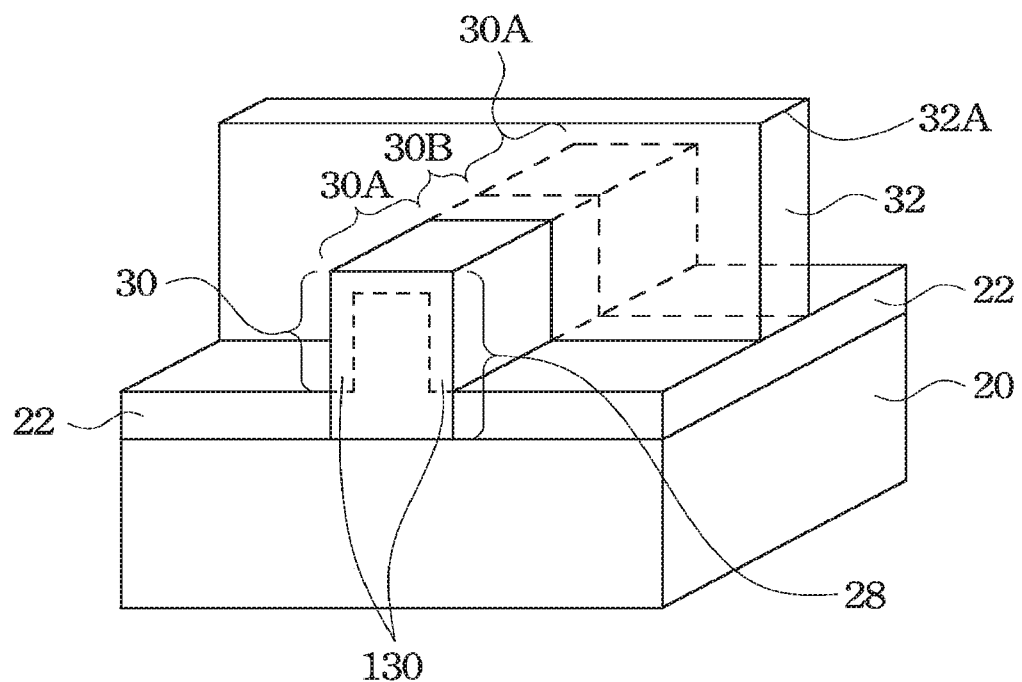

After the formation of Ge channel doping layer 130, dummy gate 32 is formed, as shown in FIG. 7. Dummy gate 32 may be formed of, for example, polysilicon, although other materials that have a high etching selectivity from the etching of STI regions 22 may also be used. Dummy gate 32 may also be formed of a material that has a high etching selectivity from the etching of semiconductor strip 28 in accordance with some embodiments. In some embodiments, dummy gate 32 has a composite structure comprising a plurality of layers, and may include, for example, a silicon nitride layer and/or a silicon oxide layer as a bottom layer (not shown), and a top layer (not shown) over the bottom layer, wherein the top layer may be a polysilicon layer, for example. Dummy gate 32 has top surface 32A higher than the top surface of semiconductor fin 30. The formation of dummy gate 32 may include forming blank layer(s), performing a CMP to level the top surface of the blank layer(s), and patterning the blank layers. The remaining portion of the blank layers(s) is dummy gate 32. Dummy gate 32 covers middle portion 30B of semiconductor fin 30, and opposite end portions 30A of semiconductor fin 30 are not covered. Dummy gate 32 may also have a lengthwise direction substantially perpendicular to the lengthwise direction of semiconductor fin 30.

Figure 8:
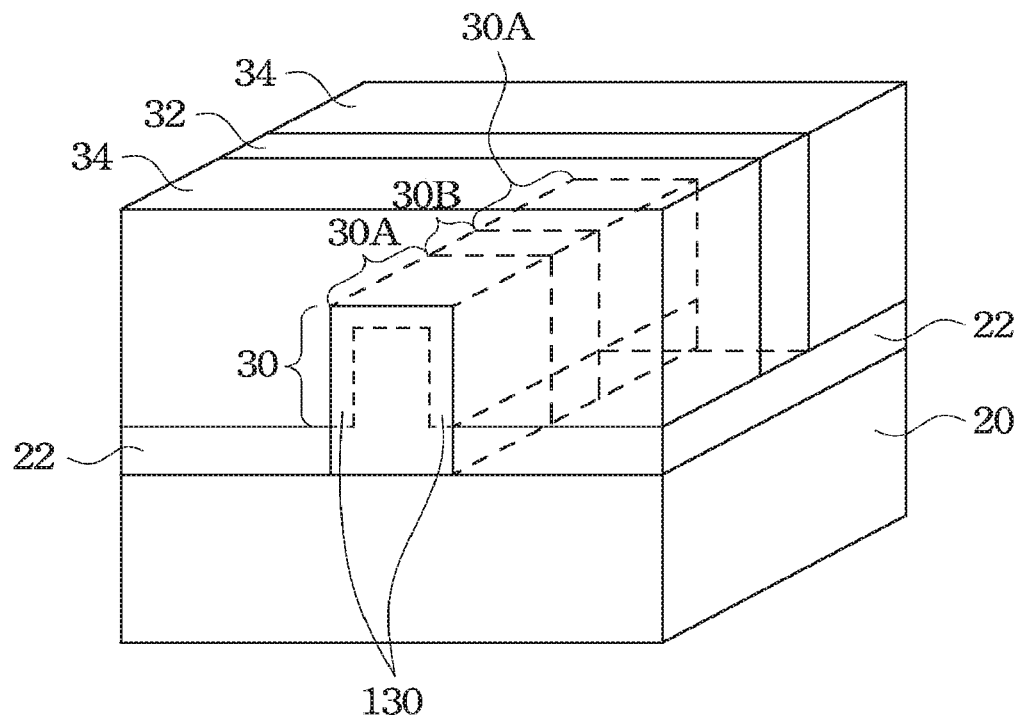

FIG. 8 illustrates a perspective view of the structure after the formation of Inter-Layer Dielectric (ILD) 34. ILD 34 is formed of a dielectric material such as Phospho-Silicate Glass (PSG), Boro-Silicate Glass (BSG), Boron-Doped Phospho-Silicate Glass (BPSG), or the like. A CMP may be performed to level the top surface of ILD 34 with the top surface of dummy gate 32. Accordingly, the end portions 30A of semiconductor fin 30 are buried under the top portions of ILD 34. The lower portions of ILD 34 extend to level with end portions 30A of semiconductor fin 30. Although not shown, spacers may be formed on the opposite sidewalls of dummy gate 32, wherein the spacers may be formed of a material different from the materials of ILD 34 and dummy gate 32.

Figure 9:
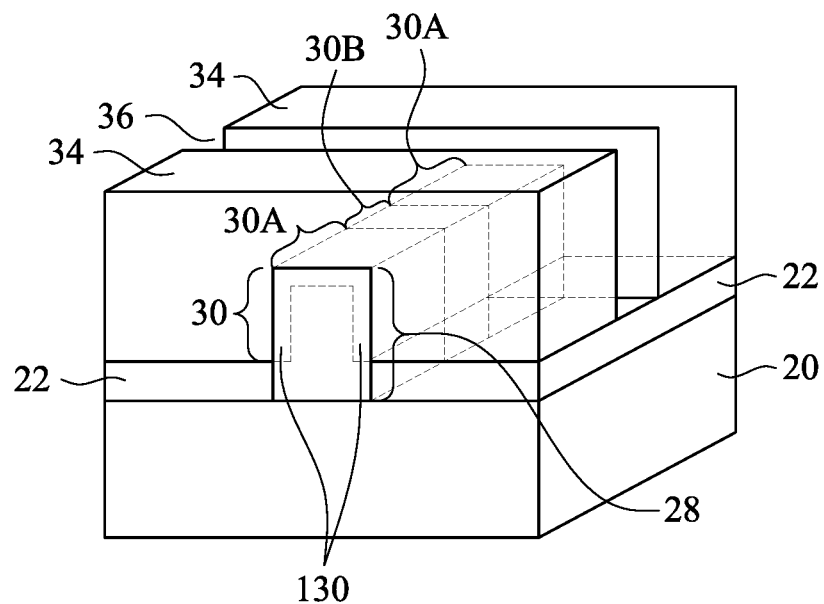

Next, dummy gate 32 is removed in an etching step, so that recess 36 is formed in ILD 34, as shown in FIG. 9. The middle portion 30B of semiconductor fin 30 is exposed to recess 36. In the embodiments wherein dummy gate 32 is a composite gate, the bottom layer (such as a silicon nitride layer) of dummy gate 32 may be used as an etch stop layer when the top layer (such as a polysilicon layer) of dummy gate 32 is etched. The bottom layer of dummy gate 32 may be removed after the removal of the top layer of dummy gate 32.

Figure 10A:
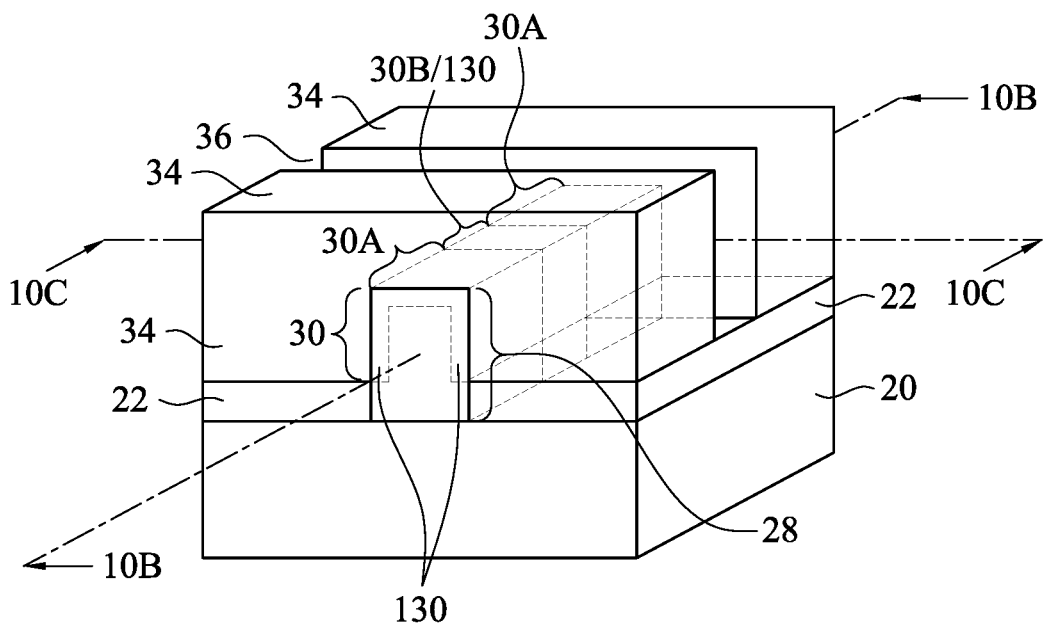
Figure 10B:
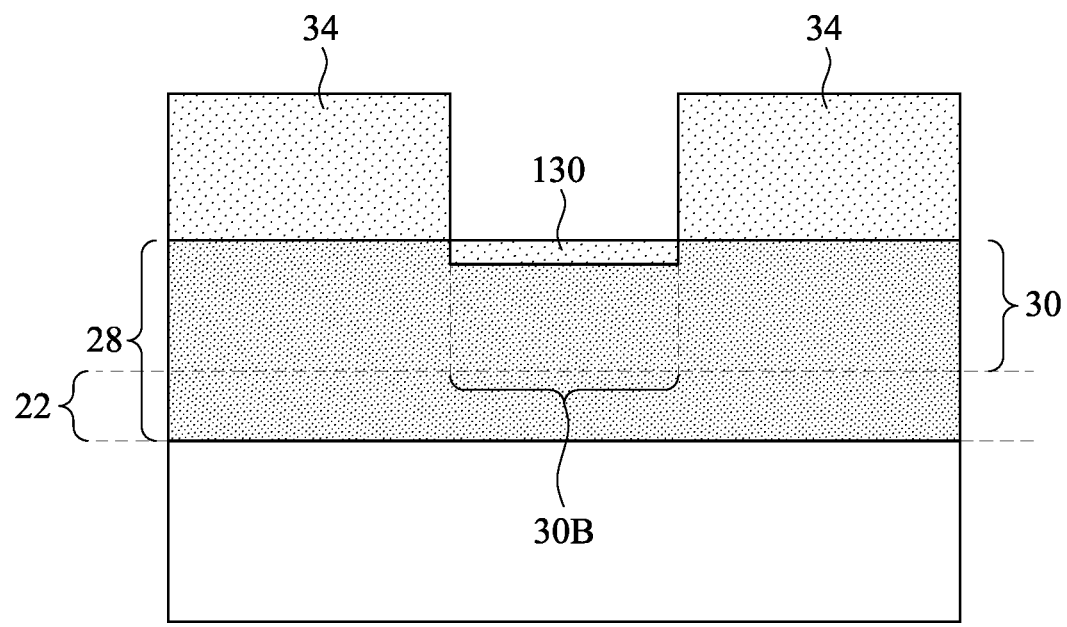
Figure 10C:
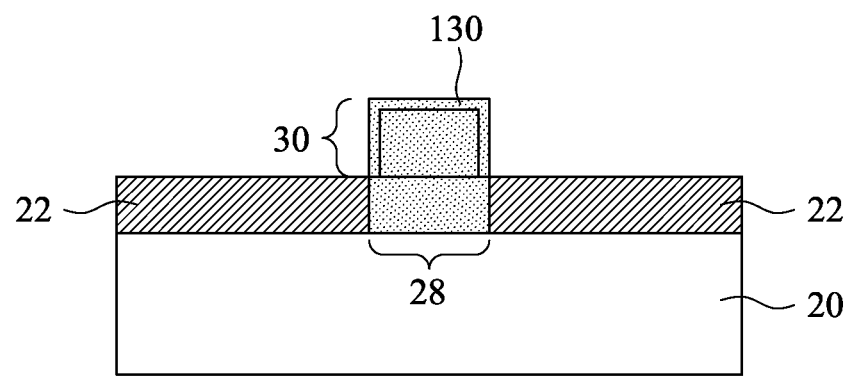

FIGS. 10A, 10B, and 10C illustrate the further formation of Ge channel doping layer 130, wherein FIG. 10B is obtained from the plane crossing line 10B-10B in FIG. 10A, and FIG. 10C is obtained from the plane crossing line 10C-10C in FIG. 10A. In some embodiments, instead of forming Ge channel doping layer 130 before the formation of dummy gate 32 (FIG. 7), Ge channel doping layer 130 may be formed after the removal of dummy gate 32 (FIG. 8), and after recess 36 (FIG. 10) is formed. In alternative embodiments, Ge channel doping layer 130 is formed using one of the methods in FIGS. 6A through 6E, and formed again in the step shown in FIGS. 10A, 10B, and 10C. In some embodiments, in the step shown in FIGS. 10A, 10B, and 10C, Ge channel doping layer 130 is formed using essentially the same formation method illustrated in FIGS. 6A through 6E. The formation methods include implantation (similar to what is shown in FIG. 6A), conformal doping (similar to what is shown in FIGS. 6B and 6C), germanium condensation (similar to what is shown in FIGS. 6D and 6E), and the like. In the embodiments wherein implantation is performed, the implantation may be performed after the removal of the dummy gate electrode (not show) in dummy gate 32, and before the removal of the dummy gate dielectric (not shown), which is under the dummy gate electrode. After the Ge implantation, the dummy gate dielectric is removed.

When formed in the step in FIGS. 10A, 10B, and 10C, Ge channel doping layer 130 is formed in middle portion 30B (which portion is used for forming the channel of the resulting FinFET), and is not formed in portions 30A (which are used for forming source and drain regions). As a comparison, in the steps in FIG. 6A through 6E, Ge channel doping layer 130 is formed in the surface layers of an entirety of semiconductor fin 30.

Figure 11B:
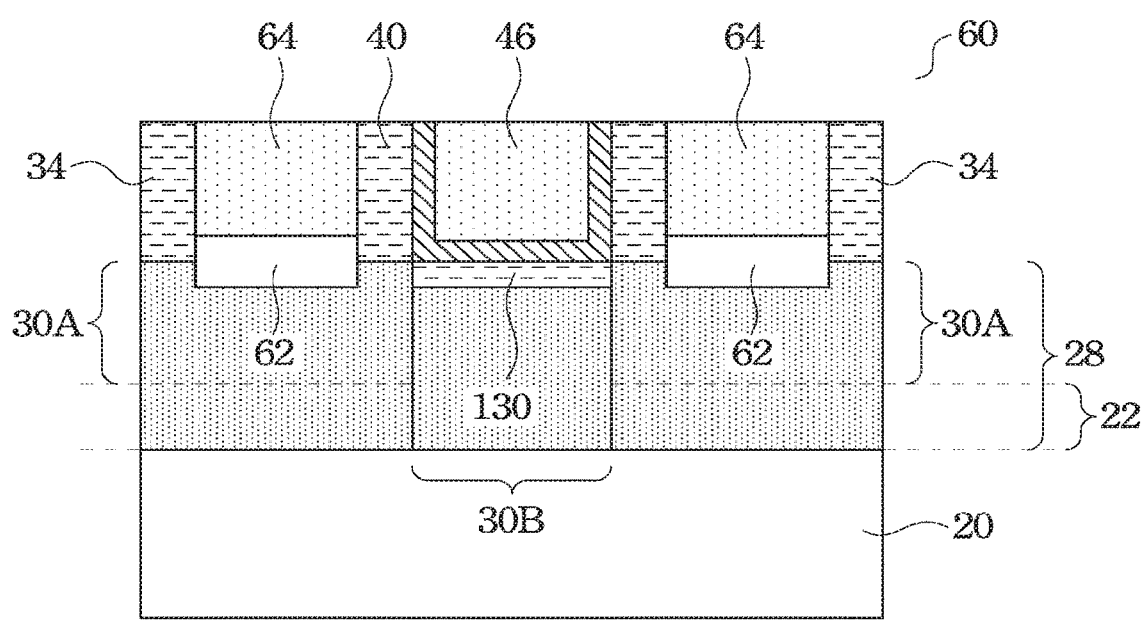
Figure 11C:
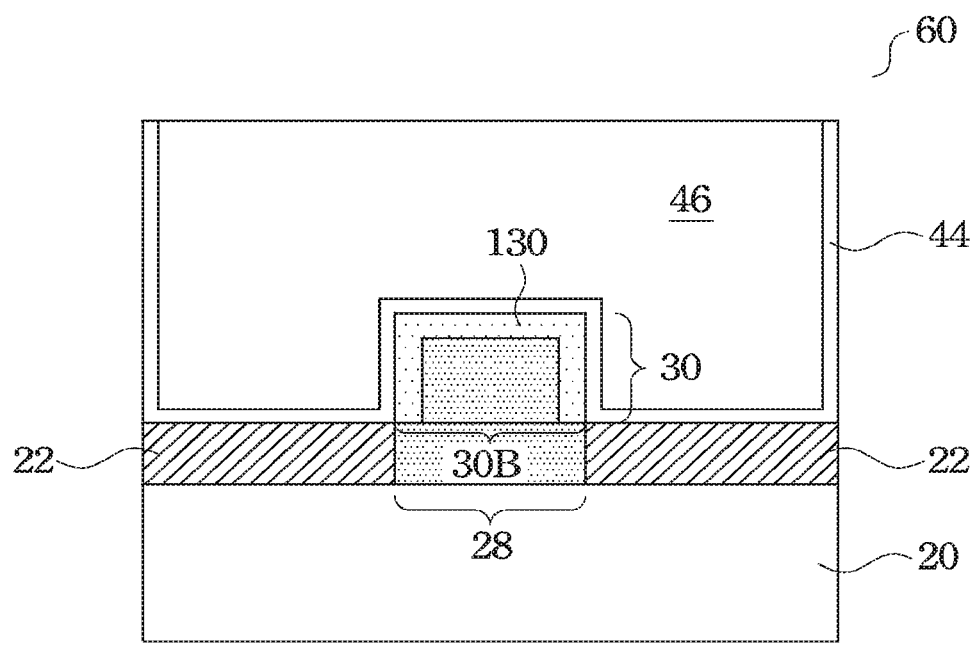

FIG. 11A illustrates the formation of gate dielectric 44 and gate electrode 46. FIGS. 11B and 11C illustrate the cross-sectional views of the structure in FIG. 11A, wherein the cross-sectional views in FIGS. 11B and 11C are obtained from the same planes that cross lines 11B-11B and 11C-11C, respectively, in FIG. 11A. For clarity, the buried portions of gate dielectric 44 and gate electrode 46 are not shown in FIG. 11A, and may be found referring to FIGS. 11B and 11C.

The intermediate stages in the formation of gate dielectric 44 and gate electrode 46 are not illustrated, and are described briefly below referring to FIGS. 10, 11A, 11B, and 11C. In the formation process, gate dielectric layer 44 is formed as a blanket layer in recess 36 (FIG. 10A) and on the top surfaces and the sidewalls of semiconductor fin portion 30B and ILD 34 (also see FIG. 10A). In accordance with some embodiments, gate dielectric layer 44 comprises silicon oxide, silicon nitride, or multilayers thereof. In alternative embodiments, gate dielectric layer 44 comprises a high-k dielectric material. In which embodiments, gate dielectric layer 44 may have a k value greater than about 7.0, and may include a metal oxide or a silicate of Hf, Al, Zr, La, Mg, Ti, Y, Sc, Lu, Gd, Sr, Dy, Ca, Sm, and combinations thereof. The formation methods of gate dielectric layer 44 may include Molecular-Beam Deposition (MBD), Atomic Layer Deposition (ALD), Plasma Enhanced Chemical Vapor Deposition (PECVD), and the like. Next, conductive material 46 is formed over gate dielectric layer 44, and fills the remaining recess 36 (FIG. 10A). Conductive material 46 may comprise a metal-containing material such as TiN, TaN, TaC, Co, Ru, Al, combinations thereof, or multi-layers thereof. The selection of the appropriate conductive material 46 may depend on whether FinFET 60 is p-type or n-type. For example, when FinFET 60 is p-type, materials having work functions close to the valence band of silicon may be selected. When FinFET 60 is n-type, materials having work functions close to the conduction band of silicon may be selected. The formation method may also include ALD. After the filling of conductive material 46, a CMP may be performed to remove the excess portions of gate dielectric layer 44 and conductive material 46, which excess portions are over the top surface of ILD 34. The resulting remaining portions of conductive material 46 and gate dielectric layer 44 thus form a replacement gate of the resulting FinFET 60 (FIGS. 11A, 11B, and 11C).

FIG. 11B also illustrates, in addition to the formation of gate dielectric 44 and gate electrode 46, the formation of source and drain silicide regions 62 and source/drain contact plugs 64, which are not shown in FIG. 11A for clarity. The formation process include forming openings (occupied by contact plugs 64) in ILD 34 to expose end portions 30A of semiconductor fins 30. In some embodiments in which end portions 30A are heavily doped as p+ or n+ regions, no further implantation is performed. Alternatively, end portions 30A may be heavily doped as p+ or n+ regions through the openings. The resulting FinFET may be a p-type FinFET or an n-type FinFET. A silicidation is then performed to silicide the exposed end portions 30A to form source/drain silicide regions 62. Contact plugs 64 are then formed to fill the openings. In the resulting FinFET 60, end portions 30A form source and drain regions of FinFET 60.

Figure 12:
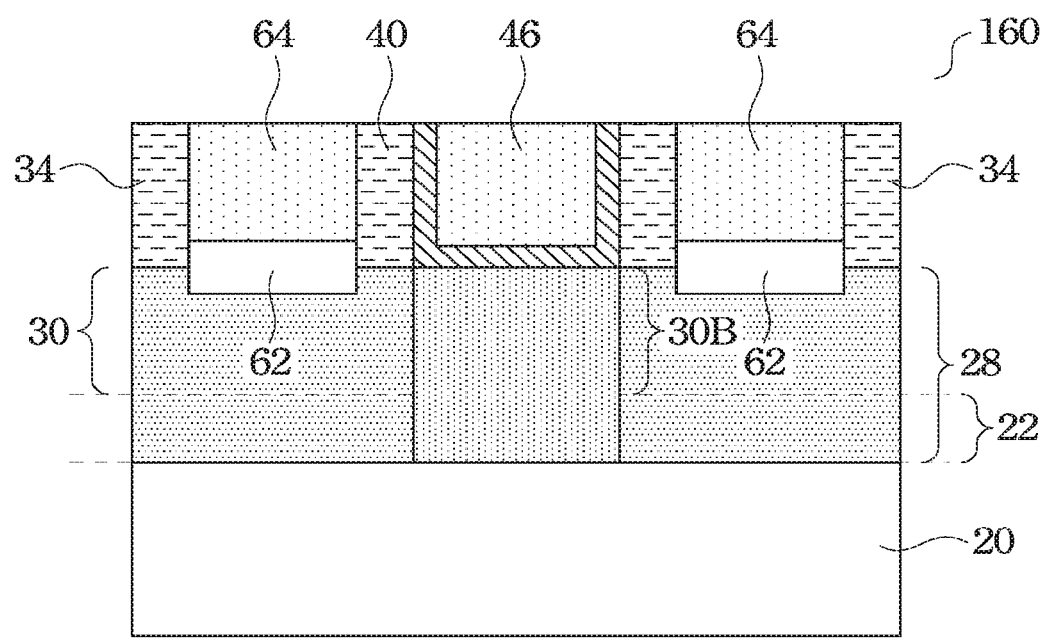
FIG. 12 illustrates a cross-sectional view of a second FinFET formed in the same die, and at the surface of the same substrate as the first FinFET, wherein no germanium channel doping is performed on the channel of the second FinFET.

FIG. 12 illustrates the cross-sectional view of FinFET 160, whose formation process may share the process steps shown in FIGS. 1 through 5, 7 through 9, and 11A. The channel doping steps as shown in FIGS. 6A-6E and 10A-10C, however, are not performed on FinFET 160. Hence, FinFET 160 and FinFET 60 have different threshold voltages.

In the embodiments of the present disclosure, by forming a germanium channel doping layer, the threshold voltages of the respective FinFET is adjusted. For example, by forming the germanium channel doping layers for n-type FinFETs, the threshold voltages of the n-type FinFETs are increased, and the heavier the germanium channel doping concentration is, the higher threshold voltages the n-type FinFETs have. Conversely, by forming the germanium channel doping layer for p-type FinFETs, the threshold voltages of the p-type FinFETs are reduced, and the heavier the germanium channel doping concentration is, the lower threshold voltages the p-type FinFETs have. Hence, by forming germanium channel doping layers having different germanium concentrations, and by forming, or not forming, the germanium channel doping layers for different FinFETs, the FinFETs in the same die may have different threshold voltages. Experiment results indicated that when the germanium channel doping layers are formed through implantations, and the dosages of the implanted germanium vary between about $1E15/cm^2$ and about $5E15/cm^2$, the threshold voltages of the FinFETs may be increased (for n-type FinFETs) or decreased (for p-type FinFETs) by about 50 mV to about 450 mV.

In accordance with some embodiments of the present disclosure, a FinFET includes a semiconductor fin including an inner region, and a germanium-doped layer on a top surface and sidewall surfaces of the inner region. The germanium-doped layer has a higher germanium concentration than the inner region. The FinFET further includes a gate dielectric over the germanium-doped layer, a gate electrode over the gate dielectric, a source region connected to a first end of the semiconductor fin, and a drain region connected to a second end of the semiconductor fin opposite the first end.

In accordance with other embodiments of the present disclosure, a device includes a semiconductor substrate, an isolation region extending into the semiconductor substrate, a semiconductor strip between and contacting two opposite portions of the isolation region, and a FinFET. The FinFET includes a semiconductor fin overlapping the semiconductor strip and over top surfaces of the isolation region. The semiconductor fin includes a silicon inner region substantially free from germanium, and a germanium-doped layer on a top surface and sidewalls of the silicon inner region. A gate dielectric is over and contacting the germanium-doped layer. A gate electrode is over the gate dielectric.

In accordance with yet other embodiments of the present disclosure, a method includes recessing isolation regions, wherein a portion of a semiconductor strip between the isolation regions is over top surfaces of the recessed isolation regions, and forms a semiconductor fin. The method further includes doping germanium into a middle portion of the fin to form a germanium channel doping layer, forming a dummy gate to cover the middle portion of the semiconductor fin, and forming an ILD to cover end portions of the semiconductor fin. The end portions of the semiconductor fin are on opposite sides of the middle portion. The dummy gate is removed to form a recess, wherein the middle portion of the semiconductor fin is exposed to the recess. A gate dielectric and a gate electrode are formed in the recess and over the germanium channel doping layer, wherein the gate dielectric includes a portion overlapping the germanium channel doping layer.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    removing a dummy gate stack in an inter-layer dielectric to form a trench, wherein a semiconductor fin is exposed to the trench;
    doping germanium on the semiconductor fin through the trench to form a germanium channel doping layer; and
    forming a gate dielectric and a gate electrode in the trench and over the germanium channel doping layer, wherein the gate dielectric comprises a portion overlapping the germanium channel doping layer.

2. The method of claim 1, wherein the doping germanium comprises implanting germanium into the semiconductor fin through tilt implantation.

3. The method of claim 1, wherein the doping germanium comprises:
    depositing a germanium layer on surfaces of the semiconductor fin; and
    performing a thermal process to diffuse the germanium into the semiconductor fin.

4. The method of claim 1, wherein the doping germanium comprises:
    depositing a silicon germanium layer on surfaces of the semiconductor fin; and performing an oxidation process to concentrate germanium in the silicon germanium layer into the semiconductor fin.

5. The method of claim 4, wherein a silicon oxide layer is formed by the oxidation process, and the method further comprises, before the gate dielectric is formed, removing the silicon oxide layer.

6. The method of claim 1 further comprising:
before the dummy gate stack is formed, performing a doping process to dope the semiconductor fin with germanium.

7. The method of claim 6 further comprising:
forming a source region and a drain region, wherein the dummy gate stack is between the source region and the drain region, and in the doping process, germanium is doped into the semiconductor fin that is between the source region and the drain region.

8. The method of claim 1, wherein the semiconductor fin comprises silicon, and the germanium is doped into surface portions of the semiconductor fin, with an inner portion of the semiconductor fin undoped with the germanium.

9. A method comprising:
forming a dummy gate stack on a top surface and sidewalls of a silicon fin;
forming an inter-layer dielectric comprising portions on opposite sides of the dummy gate stack;
removing the dummy gate stack to leave a trench in the inter-layer dielectric;
performing a first doping process through the trench to dope germanium into an outer portion of the silicon fin, wherein a germanium-doped layer is formed on a top surface and sidewall surfaces of an inner region of the silicon fin, and wherein the inner region of the silicon fin is undoped with germanium when germanium is doped into the outer portion;
forming a gate dielectric over the germanium-doped layer;
forming a gate electrode over the gate dielectric; and
forming a source region and a drain region connecting to opposing ends of the silicon fin.

10. The method of claim 9, wherein the source region and the drain region are formed before the first doping process.

11. The method of claim 9 further comprising:
before the forming the dummy gate stack, performing a second doping process to dope germanium into the silicon fin.

12. The method of claim 11, wherein the source region and the drain region are formed at a time between the first doping process and the second doping process.

13. The method of claim 9, wherein the inner region of the silicon fin comprises silicon and carbon, and is substantially free from germanium.

14. The method of claim 9, wherein the first doping process comprises:
depositing a germanium layer on a top surface and sidewalls of the silicon fin; and
performing a thermal anneal process to diffuse germanium in the germanium layer into the outer portion of the silicon fin, wherein the germanium does not diffuse into the inner region of the silicon fin.

15. The method of claim 14, wherein the thermal anneal process is performed using hydrogen ($H_2$) or an inert gas as a process gas.

16. The method of claim 9, wherein the first doping process comprises:
depositing a silicon germanium layer on a top surface and sidewalls of the silicon fin;
performing an oxidation process, so that germanium diffuse into the silicon fin to form the germanium-doped layer, wherein a silicon oxide layer is generated on the germanium-doped layer; and
removing the silicon oxide layer.

17. A method comprising:
recessing isolation regions, so that a portion of a semiconductor strip between the isolation regions protrudes higher than top surfaces of the recessed isolation regions to form a semiconductor fin;
depositing a silicon germanium layer on a top surface and sidewalls of a first portion of the semiconductor fin, wherein when the silicon germanium layer is deposited, a second and a third portion of the semiconductor fin on opposite sides of the first portion are covered by dielectric materials;
performing a thermal oxidation process on the silicon germanium layer to form a germanium-doped layer;
removing a silicon oxide layer generated by the thermal oxidation process to reveal the germanium-doped layer; and
forming a gate dielectric and a gate electrode over the germanium-doped layer.

18. The method of claim 17, wherein the germanium-doped layer is deposited on a top surface and sidewalls of the semiconductor fin, and the semiconductor fin comprises silicon.

19. The method of claim 17, wherein the thermal oxidation process is performed in an oxygen ($O_2$) containing environment.

20. The method of claim 17 further comprising:
forming a source/drain region based on a portion of the semiconductor fin;
forming a dummy gate on the semiconductor fin; and
removing the dummy gate, wherein the silicon germanium layer is deposited after the dummy gate is removed.

* * * * *